United States Patent [19]

Iio et al.

[11] Patent Number: 5,858,480
[45] Date of Patent: Jan. 12, 1999

[54] CERAMIC-BASED SUBSTRATE FOR COATING DIAMOND AND METHOD FOR PREPARING SUBSTRATE FOR COATING

[75] Inventors: Satoshi Iio, Kakamigahara; Takahisa Ushida, Nagoya; Takashi Okamura, Aichi-gun; Masakazu Watanabe, Nagoya, all of Japan

[73] Assignee: NGK Spark Plug Co., Ltd., Nagoya, Japan

[21] Appl. No.: 718,183

[22] Filed: Sep. 19, 1996

Related U.S. Application Data

[62] Division of Ser. No. 249,039, May 25, 1994.

[30] Foreign Application Priority Data

| May 25, 1993 | [JP] | Japan | 5-145634 |
| Mar. 23, 1994 | [JP] | Japan | 6-75492 |
| Apr. 8, 1994 | [JP] | Japan | 6-93936 |

[51] Int. Cl.⁶ .................................................. C23C 16/02
[52] U.S. Cl. ..................................... 427/590; 427/255.3
[58] Field of Search ........................... 427/255.3, 590

[56] References Cited

U.S. PATENT DOCUMENTS

| 4,277,283 | 7/1981 | Tobioka et al. | 75/238 |
| 4,731,296 | 3/1988 | Kuchi et al. | 428/408 |
| 4,990,403 | 2/1991 | Ito | 428/408 |
| 5,328,761 | 7/1994 | Omori et al. | 428/336 |
| 5,391,422 | 2/1995 | Omori et al. | 428/212 |

FOREIGN PATENT DOCUMENTS

| 0 200 991 | 11/1986 | European Pat. Off. |
| 0 519 895 | 12/1992 | European Pat. Off. |
| 0 549 801 | 7/1993 | European Pat. Off. |
| 0 550 763 | 7/1993 | European Pat. Off. |
| JP-A-54-87719 | 7/1979 | Japan . |
| 58 067 859 | 4/1983 | Japan . |
| 62-1853 | 1/1987 | Japan . |
| 62-7267 | 2/1987 | Japan . |
| JP-A-1-246361 | 10/1989 | Japan . |
| JP-A-4-231428 | 8/1992 | Japan . |
| JP-A-4-263074 | 9/1992 | Japan . |
| JP-A-4-263075 | 9/1992 | Japan . |
| 5-221725 | 3/1993 | Japan . |
| WO-A-93 00454 | 1/1993 | WIPO . |
| WO-A-93 02022 | 2/1993 | WIPO . |

OTHER PUBLICATIONS

Y. Saito et al., "Adhesion strength of diamond film on cemented carbide insert", *Diamond and Related Materials*, vol. 2, No. 1993, Sep. 1992, pp. 1391–1395.

"Powder and Powder Metallurgy", vol. 29, No. 5, pp. 159–163 (no English abstract).

*Primary Examiner*—Archene Turner
*Attorney, Agent, or Firm*—Morrison & Foerster LLP

[57] ABSTRACT

Ceramic-based substrate for coating, e.g., diamond has a basic irregularities surface having a surface roughness Rz of 2 to 20 μm, with Rz at angle regions of 40% or more of that for other than the angle regions. The basic irregularities surface has micro-sized irregularities on an order of crystal grains constituting the uppermost surface (0.5 to 10 μm), forming dual irregularities surface structure. Coating layer engages with surface irregularities to secure firm adhesion at the cutting edge. WC-based cemented carbide is used as substrate and N-containing surface layer is formed by heat treatment to form the surface irregularities.

14 Claims, 12 Drawing Sheets

10μm

CERAMIC-BASED SUBSTRATE FOR COATING DIAMOND AND METHOD FOR PREPARING SUBSTRATE FOR COATING

This application is a divisional of now allowed application Ser. No. 08/249,039, filed May 25, 1994, pending.

FIELD OF THE INVENTION

This invention relates to a ceramic-based substrate for coating and, more particularly, to a ceramic-based substrate for coating thereon of a hard film, such as a diamond film or a cubic boron nitride (CBN) film. The ceramic-based substrate of the present invention, on which the hard film, such as the diamond or CBN film, is coated, may be used as machining tools, such as cutting tools (inserts), end mills, cutters or drills, wear-resistant members, electronic members, such as heat sinks.

BACKGROUND

Related Art

With diamond-coated hard materials comprising a substrate and diamond coated thereon, the diamond coating layer has only a low adhesion strength with respect to the substrate, such that the diamond coating layer tends to be peeled off from the substrate. Various techniques, such as exemplified hereinbelow, have hitherto been proposed in order to improve the adhesion strength of the diamond coating layer on the substrate.

In JP Patent KOKAI Publication No. 1-246361 (JP-A-246361/89) there is disclosed a sintered alloy having a specified coating film formed on a heated surface of a sintered alloy having a specified composition.

In JP Patent KOKAI Publication No. 4-231428 (JP-A-231428/92), there is disclosed a method for producing a machining tool comprising secondary sintering of a cemented carbide (superhard alloy) tool of a particular composition under specified conditions followed by chemical etching and ultrasonic grinding/polishing for forming a diamond coating layer.

In JP Patent KOKAI Nos. 4-263074 (JP-A-263074/92) and 4-263075 (JP-A-263075/92), there is disclosed a hard material comprising a substrate presenting specified surface irregularities and a diamond coating layer formed thereon.

Among the techniques preceding the above techniques, there are those described in JP KOKAI Patent Publication No. 54-87719 (JP-A-87719/79) and No. 58-126972 (JP-A-126972/83) corresponding to JP Patent KOKOKU Publication No. 62-7267.

In "Powder and Powder Metallurgy", vol. 29, No. 5, pages 159 to 163, there is report on the formation of a hard layer on the surface of a WC-β-Co alloy, where β is a WC-TiC solid solution. Thus it is stated therein that, if the alloy is heated at 1673K in $N_2$ at 5.1 kPa ($5 \times 10^{-2}$ atmosphere), a hard layer presenting sharp surface irregularities is formed; such hard layer is formed at a $N_2$ pressure of not lower than about 0.7 kPa (about $7 \times 10^{-3}$ atmosphere); and that the higher the $N_2$ pressure and the longer the heating time employed, the coarser become the grains (β(N) grains) of the WC—TiC—TiN solid solution and the more outstanding become the surface irregularities, with formation of Co pools on the surface region.

Problems to be Solved by the Invention

Based on the eager investigations in the art by the inventors, the following points have turned out.

By the above related-art techniques, the diamond coating layer may be bonded to the substrate with as yet an insufficient adhesion strength, such that the diamond coating layer tends to be peeled off from the substrate and hence the resulting hard material is insufficient in durability. Thus the demand is raised for a substrate for coating which assures sufficient tight bonding properties with respect to a hard coating film, such as a diamond film, such that the resulting coated substrate may be employed for a machining tool used under extremely severe conditions, such as a tool used for milling an Al alloy containing a large quantity of Si. However, the conventional substrates for coating exhibit only poor bonding properties.

In addition, the method described in "Powder and Powder Metallurgy" is not disclosed as being a method for the preparation of a substrate coated by a diamond film at all, such that it is not clear whether or not the method can be used for satisfactorily coating a diamond film on the substrate. Besides, since heating is performed under a reduced pressure, heating conditions are difficult to control to render it difficult to produce the substrates for coating in large quantities.

SUMMARY OF THE DISCLOSURE

It is an object of the present invention to provide a novel substrate for coating, a coated substrate and a method for producing same, which can overcome the drawbacks of the conventional techniques.

According to the present invention, the above object may be accomplished by the following substrate for coating, coated substrate and method for producing the substrate for coating.

(i) A ceramic-based substrate for coating having a surface presenting basic surface irregularities having a surface roughness Rz of 2 to 20 μm.

(ii) A ceramic-based substrate for coating having a surface presenting basic surface irregularities having a surface roughness Rz of 2 to 20 μm, with surface roughness Rz at angle regions being 40% or more of a surface roughness Rz at the regions other than the corner regions.

(iii) A coated substrate comprising the above ceramic-based substrate coated with a hard film, preferably a diamond coating film.

(iv) A method for producing a substrate for coating comprising (a) providing a WC-based cemented carbide piece mainly composed of WC, (b) heat-treating said cemented carbide piece at a temperature not lower than a temperature at which a liquid phase of said WC-based cemented carbide piece is generated and not higher than its sintering temperature under a normal-pressure atmosphere containing a $N_2$ gas of 0.05 to 5 vol %, and (c) forming a N-containing surface layer presenting surface irregularities on a surface of said WC-based cemented carbide piece.

(v) A method for producing a substrate for coating comprising (a) providing an angle region of a WC-based cemented carbide piece, mainly composed of WC, with a rounded (or chamfered) profile in which a profile line on the cross-section of the angle region comprises a curve having a radius of curvature R of not less than 0.005 mm, (b) heat-treating the WC-based cemented carbide piece from the step (a) at a temperature not lower than a temperature of generating a liquid phase of said WC-based cemented carbide and lower than its sintering temperature, under a normal-pressure atmosphere containing 0.05 to 5 vol % of a $N_2$ gas, and (c) forming a N-containing surface layer presenting surface irregularities on a surface of said WC-based cemented carbide piece.

The surface of the ceramic substrate for coating presenting surface irregularities (protrusions and recesses) has a surface presenting the basic surface irregularities (may be referred to as "basic irregularity surface" herein) which preferably has micro-sized surface irregularities having a size on an order of the size of crystal grains making up the outermost substrate surface (typically of 0.5 to 10 $\mu$m) and, more preferably, has micro-sized irregularities 1 to 5 $\mu$m and smaller than the roughness of the basic irregularities, relative to the basic irregularity surface, resulting in a dual-irregularity-surface structure.

These micro-sized irregularities extend in a direction not only normal, but also obliquely or further transversely (parallel) with respect to the basic irregularity surface.

In the following, meritorious effects of the invention will be summarized.

Since the ceramic-based substrate for coating according to the present invention has the above-mentioned specified basic surface irregularities, a hard coating layer, such as a diamond layer, formed on its surface, is bonded strongly to the substrate surface without the risk of peeling-off.

The method for producing a substrate for coating according to the present invention comprises (a) providing a WC-based cemented carbide piece mainly composed of WC, (b) heat-treating said cemented carbide piece at a temperature not lower than a temperature at which a liquid phase of said WC-based cemented carbide piece is generated and not higher than its sintering temperature under a normal-pressure atmosphere containing a $N_2$ Gas of 0.05 to 5 vol %, and (c) forming a N-containing surface layer presenting surface irregularities on a surface of said WC-based cemented carbide piece.

Therefore, when a hard coating layer, such as a diamond layer, is formed on the surface of the N-containing surface layer presenting surface irregularities, the coating layer is strongly bonded to the surface layer to provide a substrate for coating unsusceptible to peeling-off.

The ceramic-based substrate for coating according to the present invention has the above-mentioned (basic surface irregularities) and the surface roughness Rz at the angle region amounts to not less than 40% of the surface roughness Rz of the region other than the angle region. Thus the hard coating layer, such as a diamond layer, formed on its surface becomes strongly affixed to the substrate surfaces without the risk of peeling-off.

The method for producing the substrate for coating according to the present invention comprises (a) chamfering an angle region of a WC-based cemented carbide piece, mainly composed of WC, so that the profile line on the cross-section of the angle region includes a curve having a radius of curvature R of not less than 0.005 mm, (b) heat-treating the WC-based cemented carbide piece from the step (a), at a temperature not lower than a temperature at which a liquid phase of said WC-based cemented carbide piece is generated and not higher than a sintering temperature under a normal-pressure atmosphere containing a $N_2$ gas of 0.05 to 5 vol %, and (c) forming a N-containing surface layer presenting surface irregularities on a surface of said WC-based cemented carbide piece.

Consequently, a hard coating layer, such as a diamond layer, formed on the surface of the N-containing surface layer presenting surface irregularities, to produce a substrate for coating, is strongly bonded to the surface layer without the risk of peeling-off.

Thus it is possible with the present invention to produce any of a variety of machining tools, wear resistant members or electronic members which is not susceptible to peeling-off of hard coating layers, such as diamond layers, and which may be used for an extended period of time.

SUMMARY OF PREFERRED EMBODIMENTS

Preferably, the basic irregularity surface has an engaging ratio of 1.2 to 2.5 and an amplitude of the irregularities of 2 to 20 $\mu$m.

Also preferably, the basic irregularity surface has a surface roughness (Rz) of 3 to 10 $\mu$m measured on components of the basic surface irregularities at a period of 25 $\mu$m or less.

Preferably, the ceramic-based substrate for coating is adapted for being coated with diamond. Also preferably, the ceramic-based substrate for coating comprises (or is made up of) a main body of a ceramic-based substrate and at least one coating layer formed on the main body, wherein a coating layer having the dual irregularity surface structure constitutes an outermost layer.

Preferably, the main body of the ceramic based substrate is formed of a WC-based cemented carbide (superhard alloy) mainly composed of WC and containing Ti with or without Ta, and at least one of Co and Ni.

Preferably, the coating layer is mainly composed of at least one of a W—Ti—C—N solid solution and a W—Ti—Ta—C—N solid solution.

Preferably, the hard film on the substrate for coating is formed of diamond.

The above method for producing the ceramic-based substrate for coating preferably further comprises:

forming a N-containing surface irregularity layer as a basic irregularity surface having a surface roughness Rz of 2 to 20 $\mu$m on the surface of the WiC-based cemented carbide piece.

Preferably, a N-containing surface layer presenting dual surface irregularities i.e., the dual-irregularity surface structure is formed on the surface of the WC-based cemented carbide piece. The dual irregularity surface structure comprises the basic irregularity surface and micro-sized surface irregularities formed thereon with sizes of 0.5 to 10 $\mu$m approximately corresponding (or equal) to those of crystal grains making up the uppermost surface, more preferably, of a size 1 to 5 $\mu$m and smaller than the roughness of the basic irregularity surface.

Preferably, there is formed a N-containing surface layer having the basic irregularity surface with an engaging ratio of 1.2 to 2.5 and an amplitude of irregularities of 2 to 20 $\mu$m on the surface of the WC-based cemented carbide piece.

Preferably, there is formed a N-containing surface layer having basic irregularity surface which has a surface roughness Rz of 3 to 10 $\mu$m for components having a period of 25 $\mu$m or less, on the surface of the WC-based cemented carbide piece.

Preferably, a cemented carbide piece mainly composed of WC and containing Ti with or without Ta, and at least one of Co and Ni is used as the WC-based cemented carbide piece.

Preferably, there is formed a N-containing surface layer having the basic irregularity surface mainly composed of at least one of a W—Ti—C—N solid solution and a W—Ti—Ta—C—N solid solution.

DESCRIPTION OF PREFERRED EMBODIMENTS

The "engaging ratio" herein means a ratio of a length of the irregular cross-sectional profile of the irregular surface (the path length of a curve constituting the irregular cross-sectional profile of the basic irregularity surface) divided by a linear distance length of the irregular cross-section (the length of a straight line interconnecting both ends of the cross-sectional profile). The "amplitudes" (of fluctuation) means the least value of a distance between two parallel lines inscribing the cross-sectional profiles (i.e., tip lines drawn at the highest protrusion and the lowest recess) of the irregular surface.

With the ceramic-based substrate for coating according to the present invention, if the surface roughness Rz of the basic surface irregularities is less than 2 $\mu$m, adhering properties cannot be improved, whereas, if it exceeds 20 $\mu$m, the substrate is lowered in strength. Since the surface roughness Rz of the angle (or corner) regions is 40% or more of the surface roughness Rz of the regions other than the angle regions, the coating film applied on the substrate may hardly be peeled off. The surface roughness Rz of the regions other than the angle regions means the surface roughness Rz of regions spaced apart from the angle regions and preferably the surface roughness Rz of a central portion of the major surface of the ceramic-based substrate for coating.

If the micro-sized irregularities as contrasted to the basic irregularity surface as a reference surface are of a size of 0.5 $\mu$m or more, the hard film, such as the diamond film, can be adhered more strongly when deposited on the substrate surface. However, the bonding property superior to those with the sizes of the micro-sized irregularities less than 10 $\mu$m cannot be obtained even if the micro-sized irregularities are of sizes exceeding 10 $\mu$m. The surface roughness Rz is defined by the average roughness of ten points as prescribed in JIS B 0601.

If the engaging ratio is less than 1.2 or the amplitude of the surface irregularities is less than 2 $\mu$m, the effects in improving the adhering properties tend to be lowered, whereas, if the engaging ratio exceeds 2.5 or the amplitude of the basic irregularity surface exceeds 20 $\mu$m, the substrate is lowered in strength and, if the coated substrate is used as a machining (or cutting) tool, the edge shape of the tool can hardly be maintained. More preferably, the engaging ratio is 1.3 to 2.0 and the amplitudes of the surface irregularities are 5 to 10 $\mu$m.

As for the basic irregularity surface, if the surface roughness Rz of the components having a period of 25 $\mu$m or less is less than 3 $\mu$m, the effect of the irregular surface in improving tight bonding properties tends to be lowered. Conversely, if the surface roughness exceeds 10 $\mu$m, the substrate tends to be lowered in strength and, if the coated substrate is used as a cutting tool, the cutting edge shape of the tool can hardly be maintained. More preferably, the surface roughness Rz is 5 to 8 $\mu$m.

The reason for setting the surface roughness Rz of the components of irregularities to have a period not more than 25 $\mu$m is that the components of the irregularities having the period of longer than 25 $\mu$m are not particularly effective in improving the engaging (or fitting) power.

The surface roughness Rz of the components of the irregularities having the period of not more than 25 $\mu$m for the basic irregularity surface is found by measuring the surface roughness of the basic irregularity surface using a non-contact type three-dimensional shape analyzer, such as RD-500 type manufactured by DENSHI KOGAKU KENKYUSHO K.K., Fourier transforming the measured waveform of the irregularities, filtering off components having a period exceeding 25 $\mu$m, and measuring the surface roughness Rz on the waveform of the irregularities obtained by inverse Fourier transformation of the resulting waveform.

It is noted that only those components having longer periods can be measured using a customary contact type surface roughness meter, a contactor of which has an tip radius of 5 to 10 $\mu$m, while it is not possible to obtain any significant results of the surface state with Rz obtained with the contact type surface roughness meter.

As for the method of the present invention, using a $N_2$ gas in the ambient-pressure heat treatment atmosphere of less than 0.05 vol %, the N-containing irregular surface layer can be formed only with considerable difficulties because of the small quantity of N in the atmosphere. If the amount of N exceeds 5 vol %, the bonding phase (, e.g., Co) contained in the WC-based cemented carbide is precipitated on the surface in a larger quantity, thereby lowering the adhering property of the diamond coating layer.

If the heat-treatment is carried out at a temperature lower than the temperature of generation of the liquid phase of the WC-based cemented carbide, the N-containing irregular surface has only insufficient surface irregularities such that a sufficient bonding property cannot be obtained on diamond coating. If the heat-treatment temperature exceeds the sintering temperature, the substrate tends to be lowered in its properties, such as strength, due to growth of grains making up the cemented carbide. By carrying out heat treatment under the ambient pressure, continuous processing by a tunnel furnace becomes feasible, besides processing by a batch furnace, with outstanding merits in cost and productivity.

If the radius of curvature R of the chamfer is less than 0.005 mm, the degree of the N-containing surface irregularities formed at angle regions after heat treatment is lower than that at the regions other than the angle regions, for example, at a central part of the major surface of the substrate for coating. Thus the coating film is lowered in bonding properties.

It is particularly preferred for a substrate used for producing cutting tools to chamfer the angle region of the WC-based cemented carbide employed in the method of the present invention so that the profile line on the cross-section of the angle region comprises a curve having a radius of curvature R of 0.005 to 0.10 mm.

That is, the cutting tool has a cutting edge which is the angle region defined by an intersection of a face and a flank. If the profile line at the cross-section of the cutting edge extending at right angles to the rake face or clearance face (cross-section of the angle region) is formed by a curve or a straight line having the radius of curvature R less than 0.005 mm, the substrate has a reduced thickness at the angle region so that the N-containing irregular surface layer produced by heat treatment is reduced in thickness and hence the surface irregularities become less outstanding than those of the regions other than the angle region. Consequently, the angle region of the coating layer tend to be inferior in the bonding property as compared to that of the regions other than the angle region.

The reason the N-containing irregular surface is reduced in thickness in the angle regions by heat treatment is possibly thought that in case with the use of the WC-based cemented carbide mainly composed of WC and containing Ti, the Ti component is migrated as a result of the heat treatment in a smaller quantity due to the reduced thickness in the angle region.

On the other hand, if the profile line includes a curve having a radius of curvature R exceeding 0.10 mm, the N-containing irregular surface layer produced by heat treatment has a sufficient degree of the surface irregularities, such that the bonding property between the angle regions and the coating layer is equivalent to those in the regions other than the angle region. However, if the angle region after coating are used as a cutting edge of the machining tool cutting chips tend to be welded due to excess increase in the cutting resistance, thus producing only a rough finishing state of a workpiece being machined.

The angle region is shaped to the above-mentioned chamfered profiled shape by honing, such as round honing.

The ceramic-based substrate herein means a hard substrate which is mainly composed of an ultra-hard ceramic material, such as carbides, nitrides, borides, composite compounds thereof, with or without oxides, or metal compounds and which is basically produced by sintering. The hard substrate includes cemented carbides (superhard alloy) or cermets composed mainly of carbides of high-melting metals and having a metal phase as a bonding phase. As for the basic irregularity surface is defined by a surface having a mean roughness of ten points as prescribed in JIS B 0601 in a range of 2 to 20 $\mu$m. The ambient pressure means preferably 0.5 to 1.5 atmosphere.

CERTAIN PREFERRED EMBODIMENTS

Ceramic-Based Substrate for Coating

The ceramic-based substrate for coating according to the present invention may be made up of a main substrate body and a coating layer thereon. One or more coating layer(s) may be provided. The coating layer is preferably engaged to the main substrate body.

The main substrate body is preferably a hard material of cemented carbide or the like and may comprise a WC—Co based cemented carbide containing TiC with or without TaC. If TaC is contained in the hard material, Ta may be replaced in part or in its entirety by at least one of V, Zr, Nb and Hf.

The coating layer is preferably, formed of at least one of a W—Ti—C—N solid solution and a W—Ti—Ta—C—N solid solution.

Coated Substrate

The coated substrate according to the present invention comprises the ceramic-based substrate of the present invention and a hard coating film coated thereon. Diamond or CBN may be used as a material for the hard coating film.

Method for Producing a Substrate for Diamond Coating

The WC-based cemented carbide is composed mainly of WC. Other components include preferably Ti, with or without Ta, and at least one of Co and Ni as a bonding phase. As a preferred composition of the WC-based cemented carbide, Ti with or without Ta amounts to 0.2 to 20 wt %, preferably 0.5 to 10 wt % and more preferably 1 to 5 wt %, calculated as carbide, and at least one of Co and Ni amounts to 2 to 15 wt %, preferably 3 to 10 wt % and more preferably 4 to 7 wt %. The alloy contains at least one of a W—Ti—C solid solution ($\beta$-phase) and a W—Ti—Ta—C solid solution ($\beta$t-phase). The $\beta$-phase and the $\beta$t phase are of a crystal Grain size of preferably 0.5 to 10 $\mu$m and more preferably 1 to 5 $\mu$m.

If the amount of Ti, calculated as carbide, is less than 0.2 wt % the N-containing irregular surface layer can be formed only with difficulties by heat treatment. Besides, the surface layer formed on heat treatment tends to be peeled off. The reason the surface layer tends to be peeled off is that the majority of the Ti component is migrated towards the surface by the heat treatment to form the W—Ti—C—N solid solution, that is the $\beta$(N) phase, on the surface, with a result that the Ti component is separated from the other alloy component to deteriorate the state of engaging. If the amount of Ti, calculated as carbide, exceeds 20 wt %, the substrate is already brittle prior to heat treatment. Besides, the substrate is increased in its coefficient of thermal expansion coefficient which becomes significantly different from that of the diamond with a consequence that a shearing stress is induced on a substrate-diamond film interface during cooling following diamond coating, thus possibly leading to peeling off of the diamond film.

The above also accounts for the reason the upper limit of Ti and Ta, Ta being occasionally contained together with Ti, is set to 20 wt %.

Meanwhile, Ta may be replaced entirely or in part by at least one of V, Zr, Nb and Hf insofar as the above-mentioned heat treatment remains not adversely affected. If the crystal phase of the above carbide is grown in size during sintering, the WC-based cemented carbide, obtained by densely sintering powders of WC, TiC, TaC and/or Co by powder metallurgy, is lowered in strength. Consequently, at least one of Cr and Mo, capable of suppressing the grain growth during the sintering, is contained in the composition, usually as a carbide, insofar as it does not adversely affect the heat treatment according to the present invention.

If the amount of at least one of Co and Ni as the bonding phase is less than 2 wt %, the WC-based cemented carbide cannot be improved in density on sintering, such that the substrate becomes insufficient in its characteristics, such as strength, as demanded of the substrate. If the amount of Co and Ni exceeds 15 wt %, these components tend to be manifested on the substrate surface during the heat treatment or diamond film formation according to the present invention, thus occasionally adversely affecting the process of the diamond film formation. On the other hand, the difference in the coefficient of thermal expansion between the substrate and the diamond film becomes significant to lead to the peeling-off of the diamond film.

If the mean grain size of the $\beta$-phase or the $\beta$t phase is less than 0.5 $\mu$m, the N-containing surface layer appearing after the heat treatment is diminished in the irregularity, or the N-containing surface layer may not be engaged together sufficiently in the inner WC-based cemented carbide layer. If it exceeds 10 $\mu$m, the engagingment may be insufficient, or the strength demanded to the WC-based cemented carbide prior to the heat treatment can occasionally not be obtained.

In the case with the N-containing cemented carbide or cermet containing the $\beta$(N) phase from the outset obtained by sintering with addition of N-containing powders, such as powders of TiN or TiC—TiN solid solution, or sintering in a nitrogen atom containing atmosphere, there may be occasions wherein surface irregularities can be produced with difficulty even through the heat treatment according to the present invention, or control of the state of the irregularities by the heat treatment atmosphere becomes difficult or impossible.

For accurately controlling the $N_2$ content in the atmosphere for heat treatment of the WC-based cemented carbide, a furnace used for the heat treatment is constructed using a refractory material not affecting the $N_2$ content in the atmosphere. A furnace made of a refractory material such as BN should not be used.

The preferred heat-treatment temperature for the WC-based cemented carbide is 1350° to 1450° C. The lower limit differs with the amount of carbon in the alloy or Co—Ni ratio.

The heat treatment time represents a factor which most significantly influences the degree of the surface irregularities of the N-containing surface layer. The N-containing surface layer having arbitary irregularities may be formed by adjusting the heat treatment time. For producing the N-containing layer stably and efficiently, adjustment is made of the heat treatment temperature and the $N_2$ content in the atmosphere. The heat treatment time is preferably set to 0.5 to 5 hours.

The heat-treatment atmosphere contains 0.05 to 5 vol % and preferably 0.5 to 3 vol % at the ambient pressure, the balance being an inert gas, such as Ar.

After forming the N-containing irregular surface layer in accordance with the method for producing the substrate for coating according to the present invention, re-heating (additional heat treatment) may be carried out in an inert atmosphere, such as an argon atmosphere, insofar as the bonding properties of the surface layer remain unaffected. In this manner, N may be released from the surface layer.

As another method for producing the effect of having the uppermost surface freed of N, equivalent to that achieved by the above-mentioned re-heating method, a hard film of, e.g., TiC may be formed by any known method, such as CVD or PVD, to a thickness for which the surface properties of the irregular surface layer are not changed significantly.

For diamond coating, the CVD method of contacting an excited mixed gas of a carbon source gas and a hydrogen gas may be employed. Above all, the microwave plasma CVD method is preferred as means allowing an accurate control of the synthesizing conditions.

It is desirable for improving the engaging (or fitting) power that the conditions for synthesis of the diamond film are set so that, in the initial stage, as many nuclei as possible are produced not only on surface protrusions but also in the inside of the surface recesses. Subsequently the film may be grown under the conditions that allow a higher rate and a satisfactory film strength.

The diamond coating may be achieved in two steps for forming two or more coating layers.

Now the present invention will be explained in more detail with reference to the Drawings and Examples.

EXPLANATION OF NUMERALS

Figure 1:
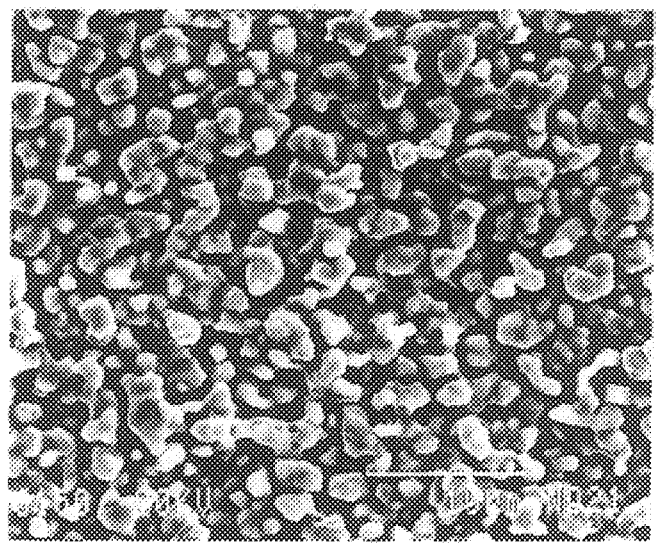
FIG. 1 is a photograph of the structure of a ceramic material showing the microstructure on the surface of a substrate (sample No. 10) of the present invention.
Figure 2:
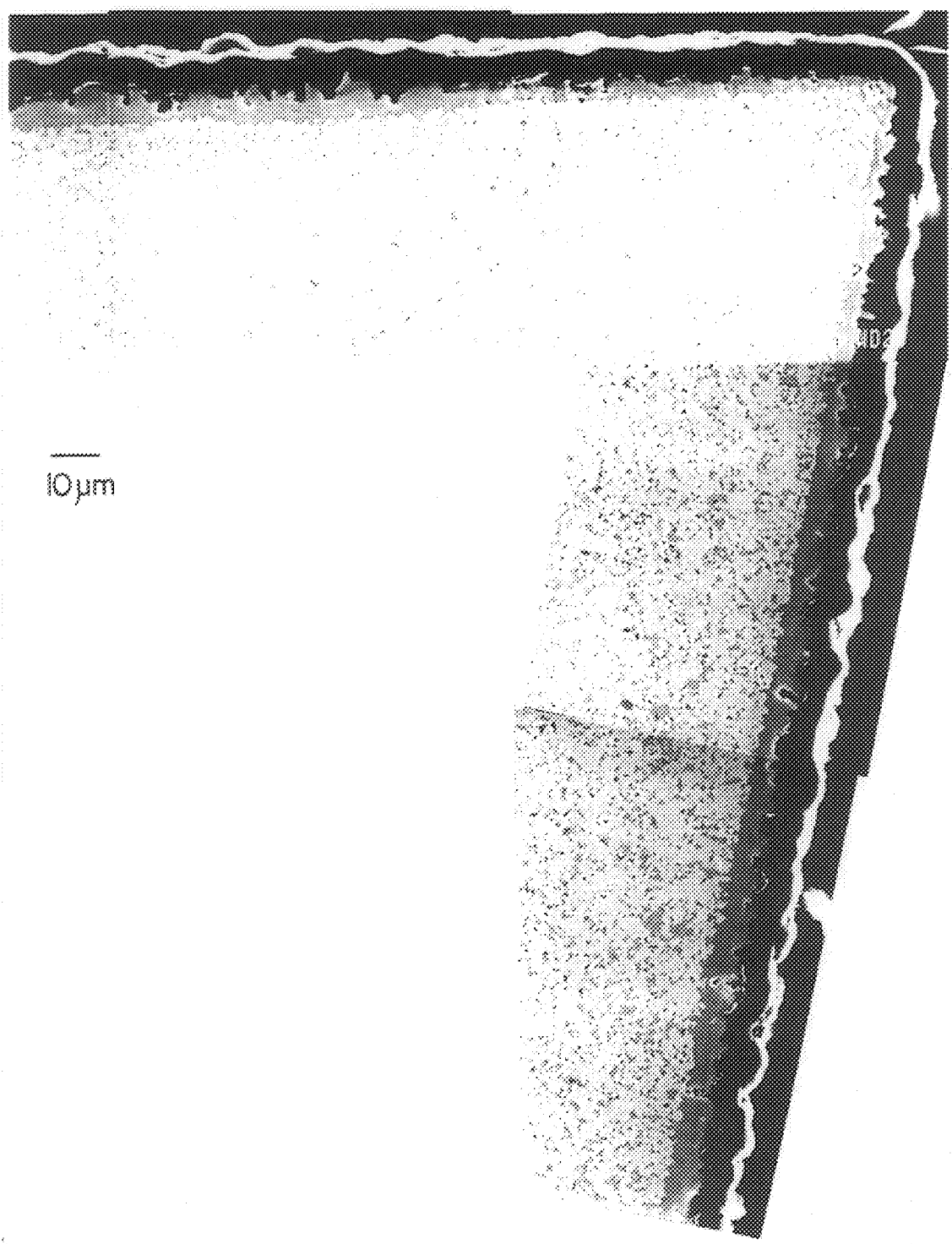
FIG. 2 is a photograph of the structure of a ceramic material showing the microstructure of a cross-sectional plane of the substrate of the present invention (sample No. 10) after diamond coating.
Figure 3:
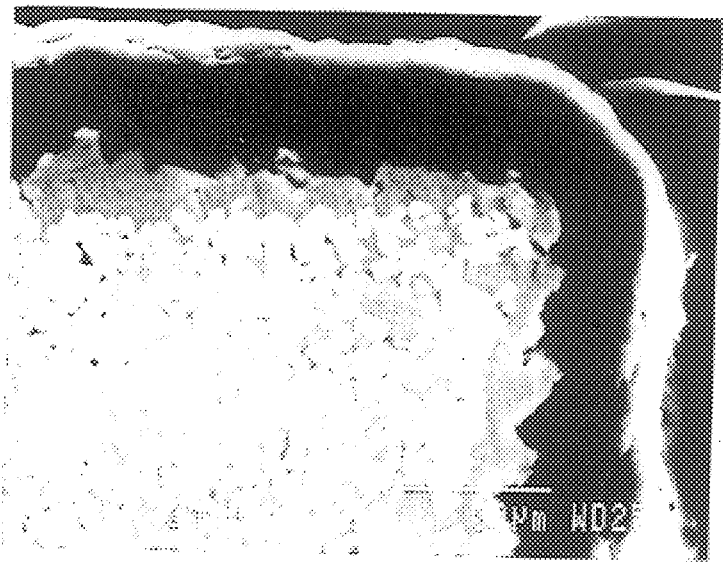
FIG. 3 is a photograph of the structure of a ceramic material showing the microstructure of a cross-sectional plane of the cutting end of a substrate of the present invention (sample No. 10) after diamond coating.
Figure 4:
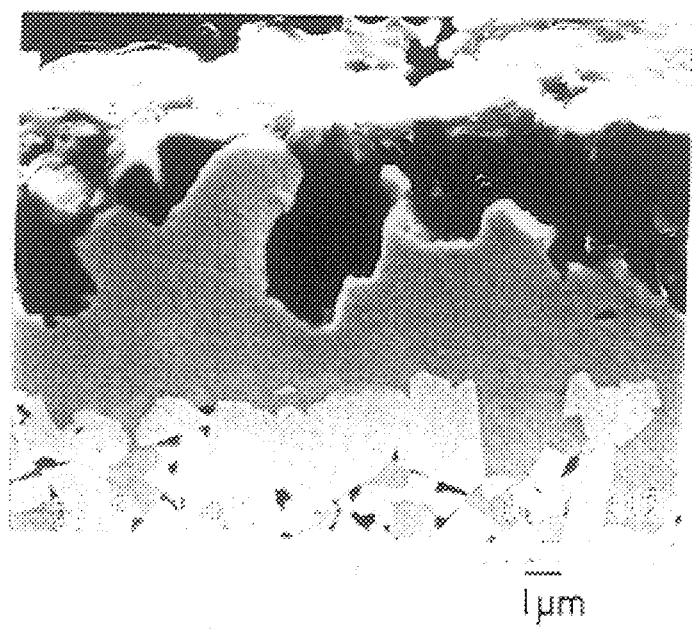
FIG. 4 is a photograph of the structure of a ceramic material showing the microstructure of a central cross-sectional plane of a substrate of the present invention (sample No. 10) after diamond coating.

1. . . cemented carbide body;

2. . . modified surface layer.

EXAMPLES

Example A

As starting powders, WC powders and powders of the TiC—WC solid solution having a mean particle size of 2 $\mu$m, TaC and Co powders having a mean particle size of 1 $\mu$m, were prepared. These starting powders were mixed so that the proportions in Table 1, calculated as WC, TiC, TaC and Co, were obtained. The mixed powders were wet mixed, dried and press molded at a pressure of 147 MPa (1.5 ton/cm$^2$) to a pressed powder mass, which was then sintered at 1400° to 1450° C. for one hour to produce sintered products, each having substantially the same composition as the above-mentioned mixed system. The sintered products were then ground on their surfaces to produce inserts (tips) each having a shape SPGN 120308 as prescribed in the ISO standard.

These inserts were charged into a carbon case and heat-treated, under the conditions shown in Table 2, using an electric furnace the portions of which exposed to elevated temperatures such as heater and insulator are all formed of carbon, thereby forming a modified surface layer having characteristics as shown in Tables 2 and 3.

The resulting substrates having modified surface layers (sample Nos. 2 to 40) and an insert not heat-treated (sample No. 1) were immersed in a solvent containing fine diamond powders having a mean particle size of 10 μm, suspended in a separated state therein, and processed with ultrasonic processing, for activating the insert surface.

The inserts thus produced were placed in a micro-wave plasma CVD apparatus with a frequency of 2.45 GHz and were maintained for ten hours in a mixed plasma of $H_2$-2% $CH_4$ heated to 850° C. and set to a total pressure of 6666 Pa (50 Torr), for producing diamond coated machining inserts each having a film thickness of approximately 10 μm. In the present experiment, the coating layer precipitated on the substrate surface was identified to be a diamond coating layer by analyses by the Raman spectroscopic method.

Using these cutting inserts, machining tests were carried out under the following conditions. It is seen from Tables 2 and 3 that the diamond-coated inserts of the present invention exhibit superior characteristics, wherein the time permitting machining with satisfactory surface accuracy without peeling-off of the diamond film is long. As contrasted thereto, in the comparative Examples, the diamond film exhibits only a poor adhesion strength and hence tends to be peeled off, wherein the time permitting machining of the workpiece with satisfactory surface accuracy is short and the substrate occasionally suffers fracture (or chipping).

Continuous Machining (machining an outer periphery of a rodlike workpiece having a diameter of approximately 150 mm and a length of approximately 200 mm)

workpiece: Al-18 wt % Si alloy cutting speed: 800 m/min feed: 0.15 mm/rev depth of cut: 0.5 mm intermittent machining: milling (machining the surface of a square plate of about 150×150 mm in size and about 50 mm in thickness)

workpiece: Al-18 wt % Si alloy cutting speed: 600 m/min feed: 0.1 mm/tooth depth of cut: 0.5 mm In Tables 2 and 3, α, β and γ stand for the crystal phases and denote the following

α: WC

β: β phase, βt phase or β(N) phase formed by solid solution of N in β- or βt-phase γ: bonding phase composed mainly of Co and/or Ni The same holds for α, β and γ in Table 5.

The possible presence of the modified surface layer was checked by elementary analyses in a cross-sectional plane along the substrate thickness as measured by the electron probe microanalysis (EPMA). If the Ti and/or Ta component is segregated near the surface and a portion entirely free of Co is found, the sample was determined "YES" to have the modified surface layer. On the other hand, if there is no difference between the surface and the inside in the dispersed state of the bonding phase containing Co or grains containing Ti and/or Ta, and a comparatively even state of dispersion is observed, the sample was determined "NOT" to be free of the modified surface layer. The same applies for Table 5.

Electron Probe Microanalysis

Figure 5:
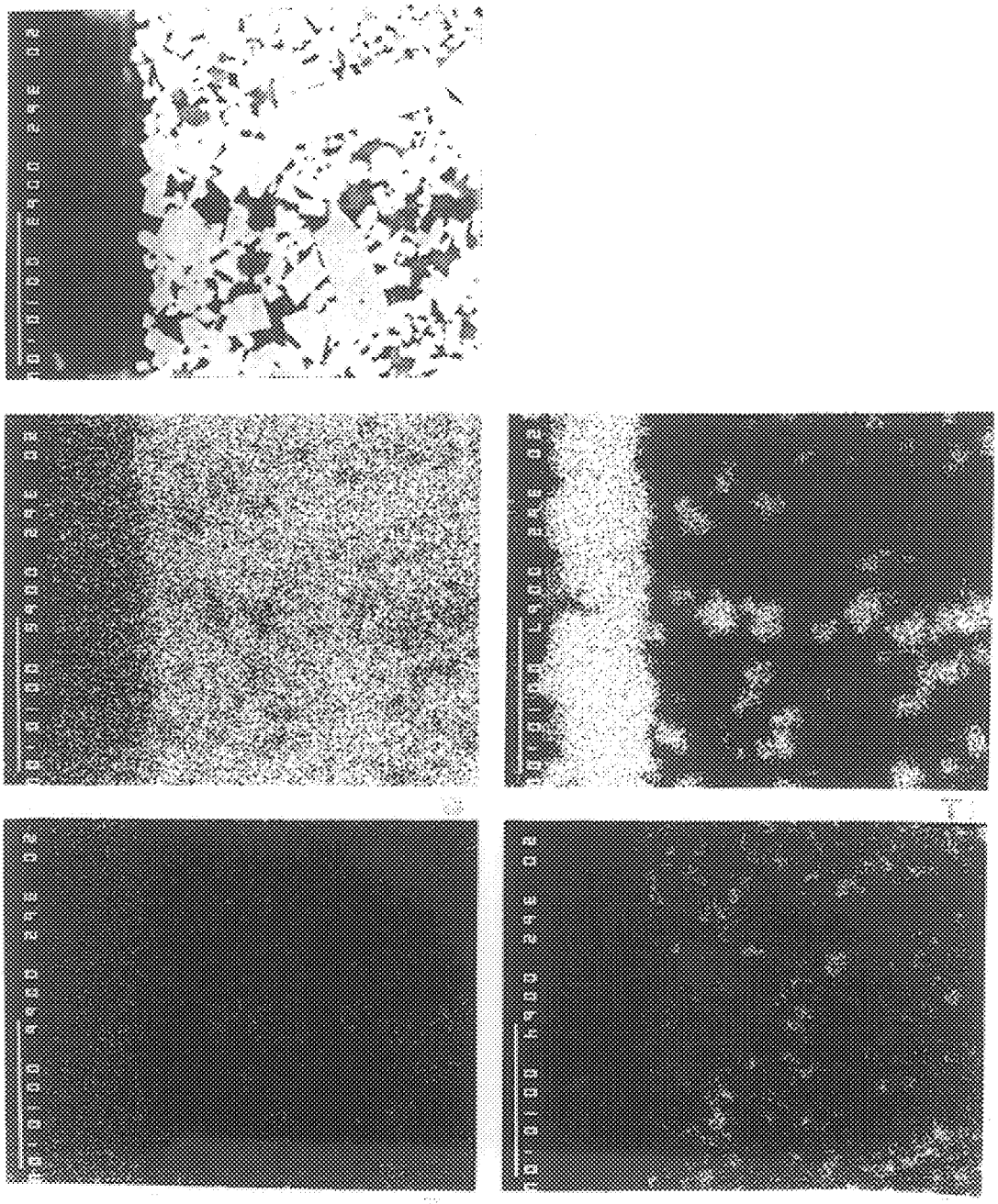
FIG. 5 is a photograph of a structure of a ceramic material showing the microstructure of the cross-sectional plane of a substrate of the present invention (sample No. 11) and a photograph showing the results of elementary analysis by EPMA which is difficult to draw by a usual drawing technique, with a left mid portion, left lower portion, right mid portion and a right lower portion indicating W, Ta, Ti and Co, respectively.
Figure 6:
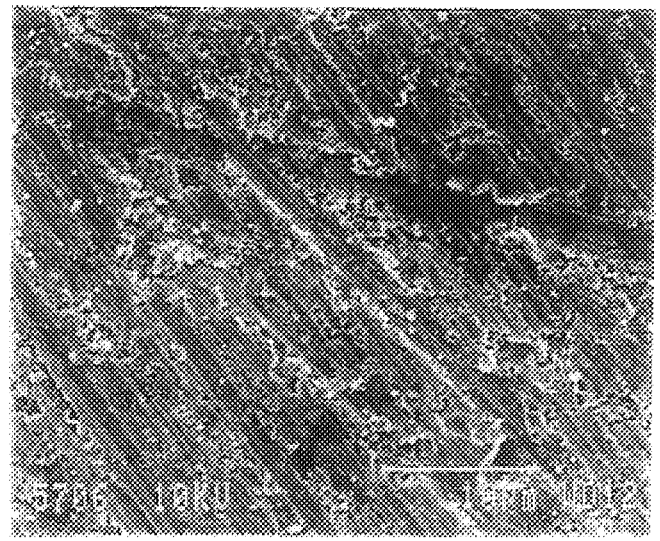
FIG. 6 is a photograph of a structure of a ceramic material showing the microstructure of a sample No. 1 (Comparative Example).
Figure 7:
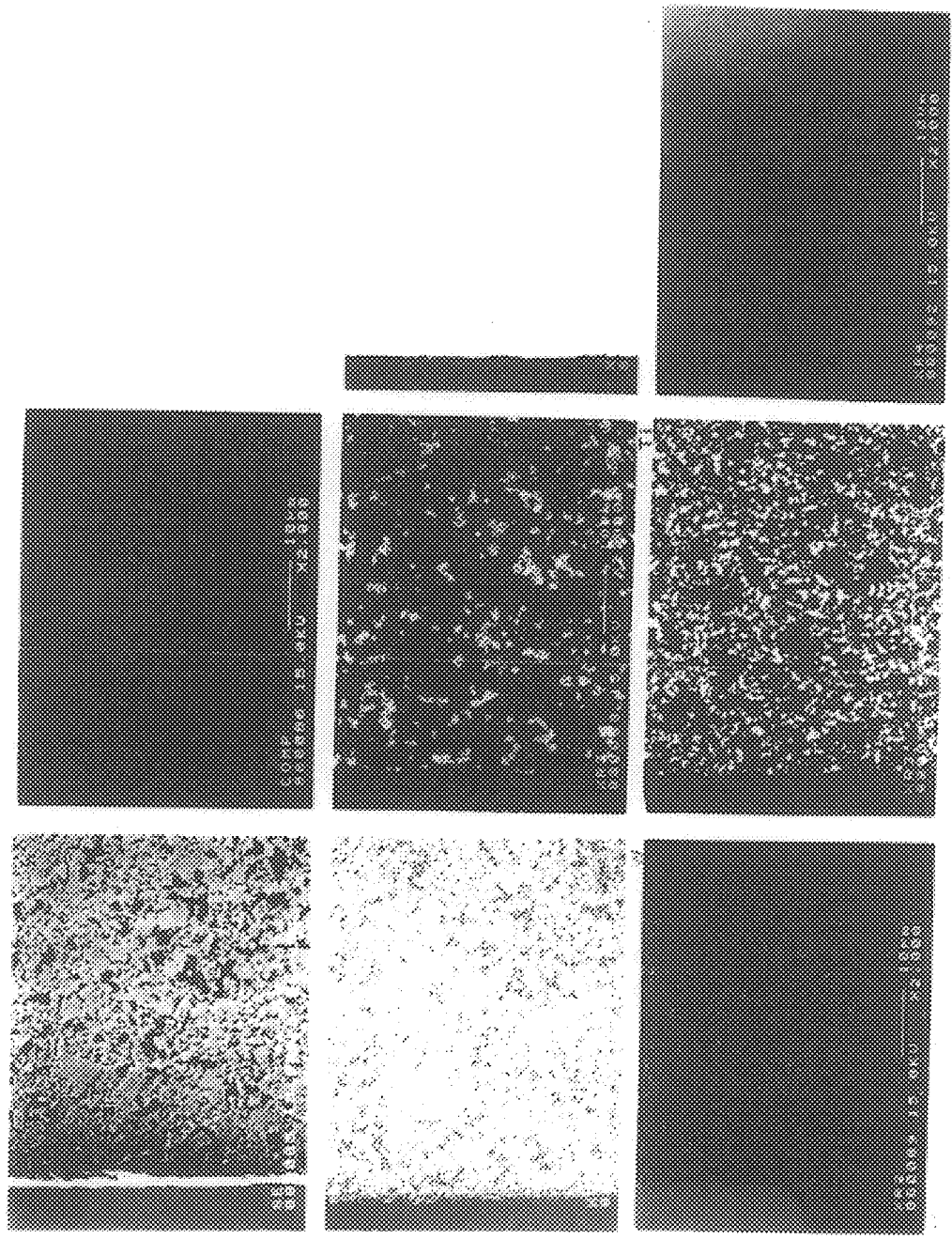
FIG. 7 is a photograph of the structure of a ceramic material showing the microstructure of a cross-sectional plane of a sample No. 1 (comparative example) at the left upper and central upper portions, and a photograph showing the results of elementary analysis of the EPMA extremely difficult to draw by usual drawing techniques, with a left central portion, left lower portion, central mid portion, central lower portion, right central portion and a right lower portion representing W, Ta, Ti, Co, C and N, respectively.
Figure 8:
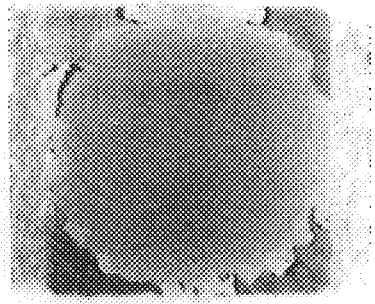
FIG. 8 is a photograph showing a microstructure of a surface of a substrate sample No. 1 having a diamond film which is partially peeled off to expose the substrate surface.
Figure 9:
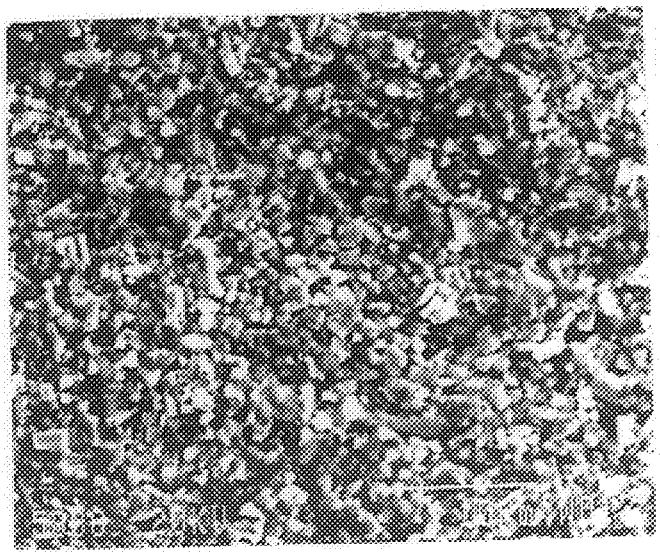
FIG. 9 is a photograph of the structure of a ceramic material showing the microstructure of the substrate surface of the sample No. 2 (comparative example).
Figure 10:
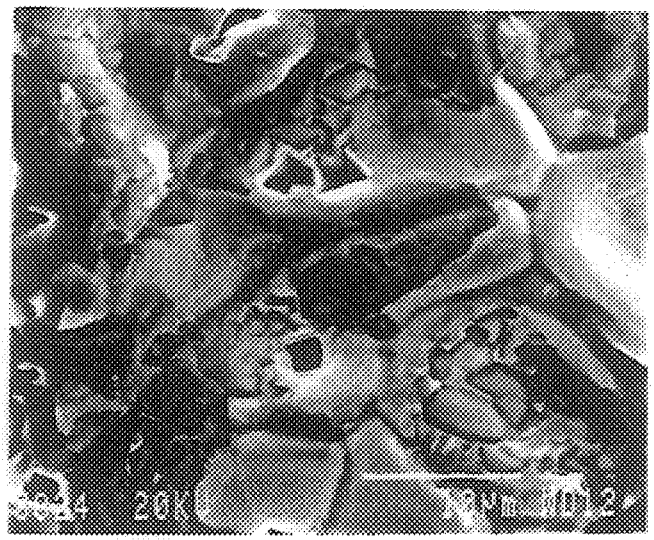
FIG. 10 is a photograph of the structure of a ceramic material showing the microstructure of the substrate surface of the sample No. 30 (comparative example).
Figure 11:
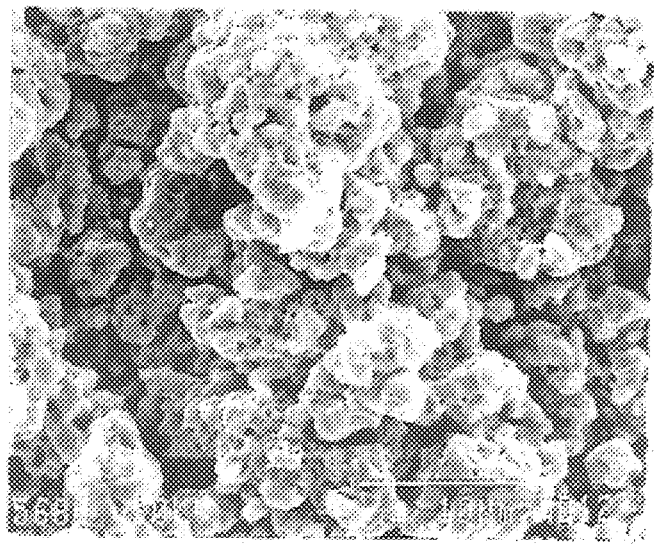
FIG. 11 is a photograph of the structure of a ceramic material showing the microstructure of the substrate surface of the sample No. 32 (comparative example).
Figure 12:
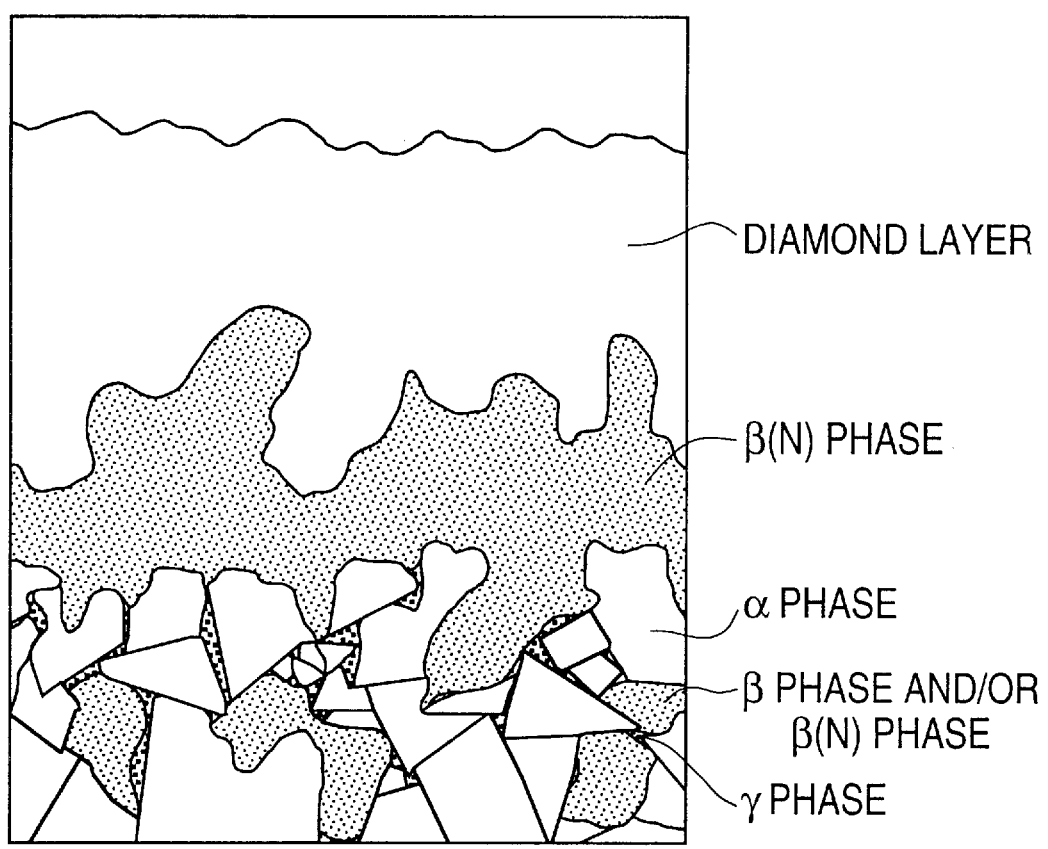
FIG. 12 is schematic view showing the microstructure of a cross-sectional plane of a substrate of the present invention after diamond coating.
Figure 13:
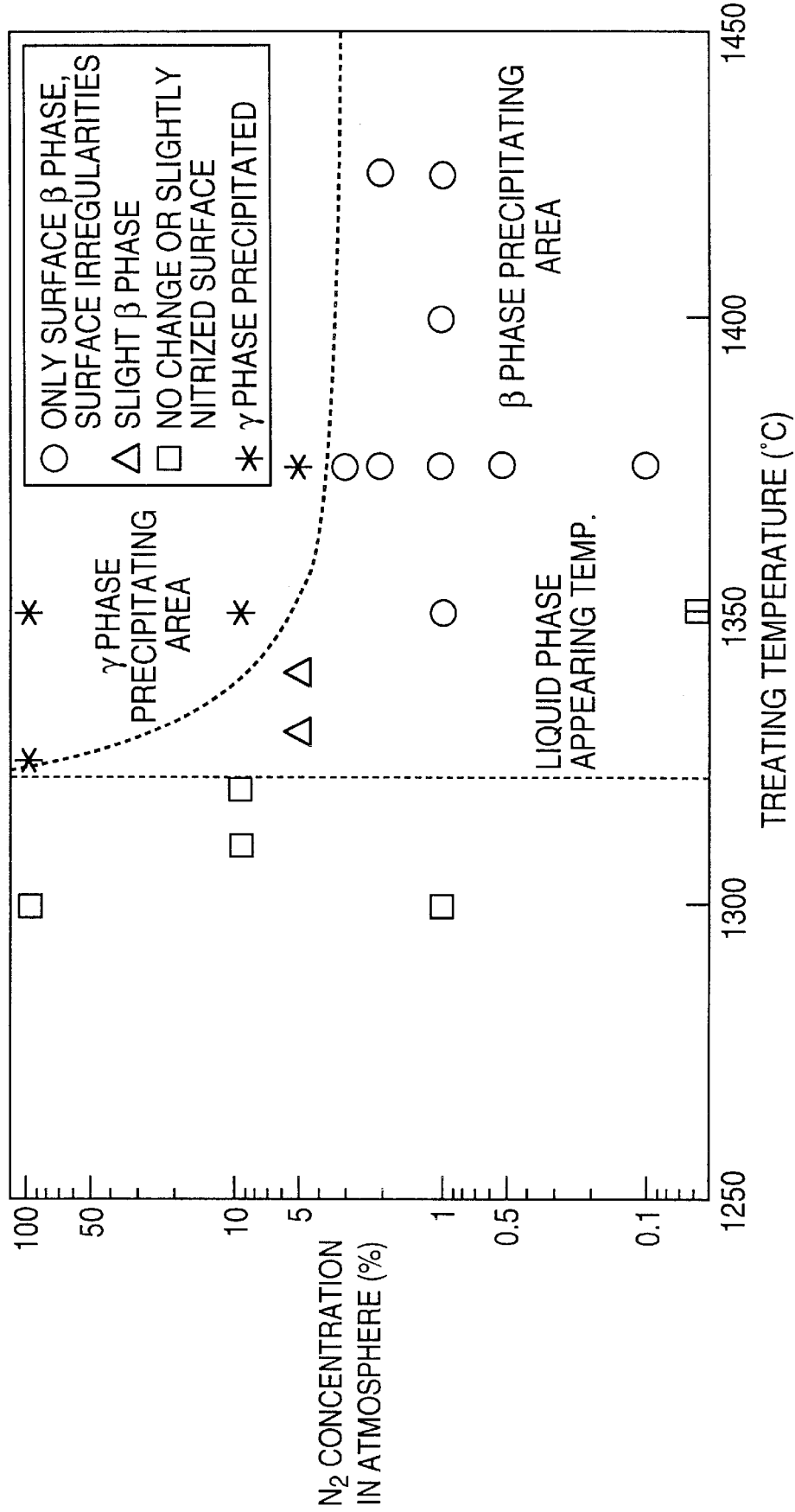
FIG. 13 is a diagram showing the heat treatment conditions according to the present invention.

For each of the substrate of the present invention (sample No. 11) and the substrate of the Comparative Example (sample No. 1), elementary analyses were conducted in the cross-sectional plane of the substrates along the thickness by the electron probe microanalysis (EPMA). It was thus found that, with the substrate of the Comparative Example, the particles containing Ti and Ta (βt phase) and the Co-containing bonding phase were dispersed substantially uniformly, with the substrate being of a structure free of the modified surface layer on its surface. Conversely, the inventive substrate was found to have a modified surface layer which contains Ti and Ta and which is completely free of Co. It was also found that the modified surface layer contained nitrogen (N). The results of the analyses are shown in FIGS. 5 and 7.

Example B

As starting powders, WC powders and powders of the TiC—WC solid solution having a mean particle size of 2 μm, TaC and Co powders having a mean particle size of 1 μm, were used. These starting powders were mixed so that the proportions in Table 4, calculated as WC, TiC, TaC and Co were obtained. The mixed powders were wet mixed, dried and press molded at a pressure of 147 MPa (1.5 ton/cm$^2$) to a pressed powder mass, which was then sintered at 1400° to 1500° C. for one hour to produce sintered products each having substantially the same composition as the above-mentioned mixed system. The sintered products were then ground on their surfaces to produce inserts each having the shape SPGN 120308 as prescribed in ISO standard.

These inserts were charged into a carbon case and heat-treated, under the conditions shown in Table 5, using an electric furnace the portions of which exposed to elevated temperatures such as heater and insulator are all formed of carbon, thereby forming a modified surface layer having characteristics as shown in Table 5.

The engaging ratio and the amplitude width were measured in the following manner.

1) The state of irregularities of a photograph of the cross-section of the irregular surface as taken by SEM, was saved as image data, using an image processor LUZEX III manufactured by NIRECO KK. The data was that of a meandering curve.

2) The total path length of the curve (defined as the length of the cross-section of the irregular surface) and the length of a straight line interconnecting both ends of the curve (defined as a straight line distance of the cross-section of the irregular surface) were measured. The length of the cross-section divided by the straight line distance of the cross-section was used as the "engaging ratio". The measured value of the straight line distance was approximately 200 μm.

3) The minimum value of the distance between two parallel lines inscribing the curve was measured by the above processor and was used as the "amplitude" or "width of amplitude".

The surface roughness Rz of the components of the irregularities having the repeating period of 25 μm or less was measured by the following non-contact manner.

The SEM was fitted with a three-dimensional analyzer RD-500 manufactured by Yugen Kaisha DEN-SHIKOGAKU KENKYUSHO for measuring the surface state. With this analyzer, a backscattering electron detector of the SEM is split in four sections for measuring changes in the scattering direction of the electron beams produced by the surface state, and data analyses are conducted by a computer in order to permit three-dimensional shape measurement. In this manner, it becomes possible to measure micro-sized irregularities which was difficult to measure with a conventional contactor type analyzer used for measuring the surface state such as surface roughness because the contactor usually has the tip end radius on the order of 5 to 10 μm.

The waveform of the cross-section presenting irregularities was found from the resulting data of the surface profile and transformed by Fourier transformation. After filtering off of the components having the period exceeding 25 μm and inverse Fourier transformation, the ten points mean roughness Rz as prescribed in JIS B 0601 was found of the resulting waveform of the irregularities. In this manner, the Rz value was obtained of the irregular components having the period of not more than 25 μm.

The surface roughness was measured using a contactor type surface roughness meter having a contactor with a tip end radius of 5 μm, and the mean radius Rz of ten points was found of the irregular components having a relatively longer period.

The resulting substrates having modified surface layers were immersed in a solvent containing fine diamond powders having a mean particle size of 10 μm, suspended in a separated state therein, and processed with ultrasonic processing, for activating the insert surface.

The inserts thus produced were placed in a micro-wave plasma CVD device-having a carrier frequency of 2.45 GHz and were maintained for ten hours in a mixed plasma of $H_2$-2% $CH_4$ heated to 850° C. and set to a total pressure of 6666 Pa (50 Torr) to produce diamond coated machining inserts each having a film thickness of approximately 10 μm. In the present experiment, the coating layer precipitated on the substrate surface was identified to be a diamond coating layer by analysis by a Raman spectroscopic method.

Using these cutting inserts, machining tests were carried out under the following conditions. It is seen from Table 5 that the diamond-coated inserts of the present invention exhibit superior characteristics, with the time permitting machining with satisfactory surface accuracy without diamond film peeling-off being long. As contrasted threto, as for the comparative Example, the diamond film exhibits only a poor adhesion strength and hence tends to be peeled off, in which the time permitting machining of the workpiece with satisfactory surface accuracy being short and the substrate being occasionally fractured.

Figure 14:
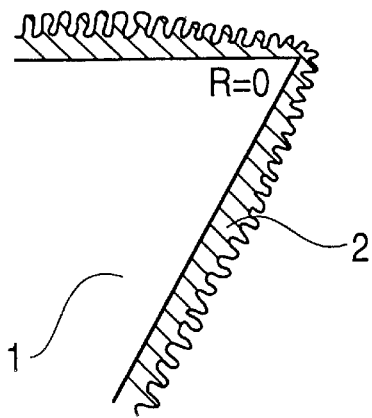
FIG. 14 is cross-sectional view of a cutting edge of a chip having a sample number 53.
Figure 15:
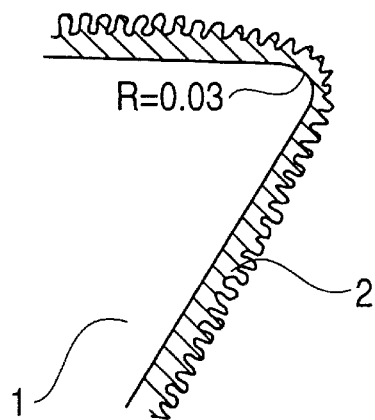
FIG. 15 is cross-sectional view of a cutting edge of a chip having a sample number 56.
Figure 16:
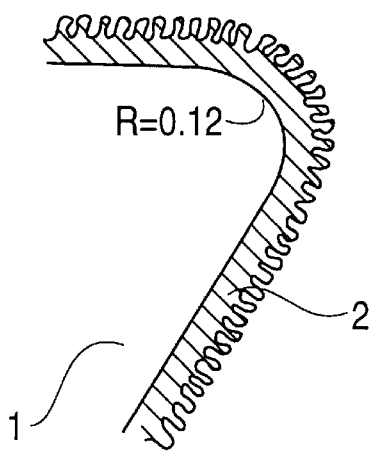
FIG. 16 is cross-sectional view of a cutting edge of a chip having a sample number 58.
Figure 17:
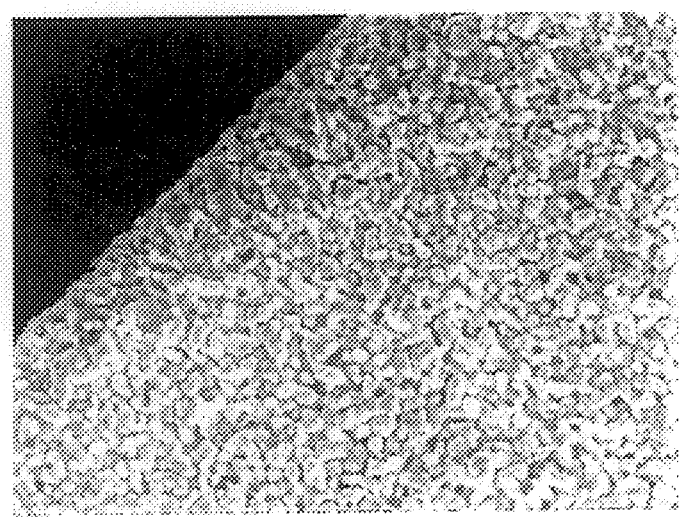
FIG. 17 is a photograph of the structure of a ceramic material showing surface irregularities on an insert having the sample number 53.
Figure 18:
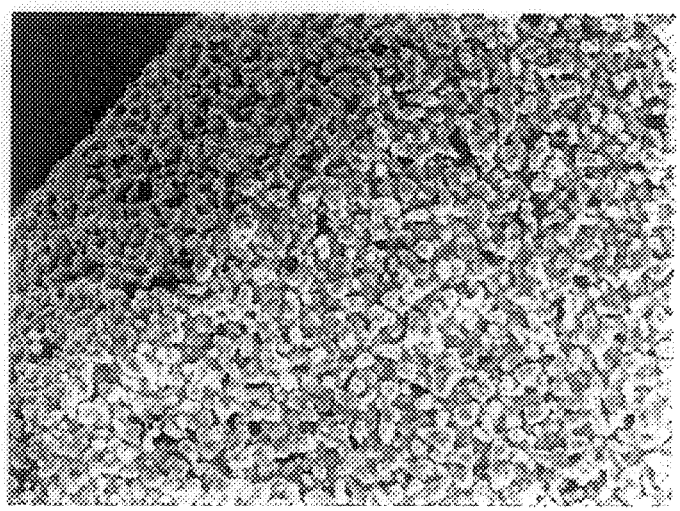
FIG. 18 is a photograph of the structure of a ceramic material showing surface irregularities on an insert having the sample number 56.
Figure 19:
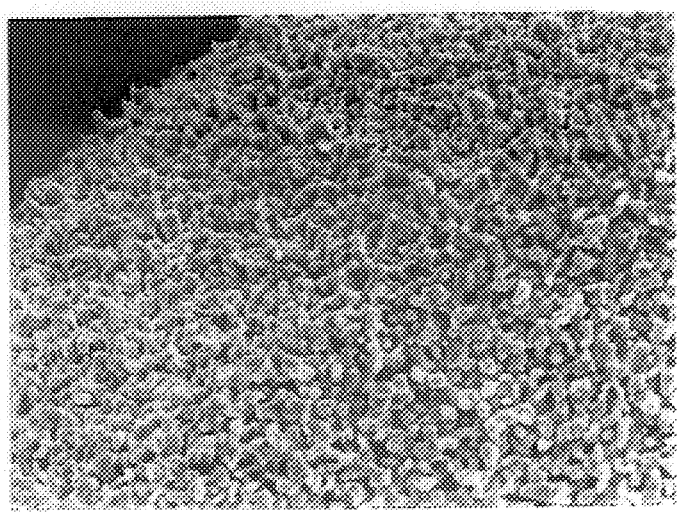
FIG. 19 is a photograph of the structure of a ceramic material showing surface irregularities on an insert having the sample number 58.

Continuous Cutting (machining an outer periphery of a rod-like workpiece having the diameter of approximately 150 mm and a length of approximately 200 mm)
  workpiece: Al-18 wt % Si alloy
  cutting speed: 1200 m/min
  feed: 0.15 mm/rev
  depth of cut: 0.5 mm
Intermittent Cutting (machining of the surface of a square plate workpiece about 150×150 mm is size and about 50 mm in thickness)
  workpiece: Al-18 wt % Si alloy
  cutting speed: 800 m/min
  feed: 0.1 mm/tooth
  depth of cut: 0.5 mm Example C A sintered member formed of a material F shown in Table 1 was produced in the same way as in Example A and ground to cemented carbide inserts having a shape conforming to ISO standard SPGN 120308. The cutting edge of the insert was honed so that a profile line at the cross-section of the cutting edge in a direction perpendicular to the rake face includes a line or a curve having a radius of curvature R as shown in Table 6. These inserts were charged in a carbon casing having a thickness of 4 mm and an inside dimension 92 mm (diameter)×31 mm. Using an electrical furnace, all the portions whereof exposed to elevated temperatures, such as heaters or insulators are formed of carbon, the inserts were heat-treated at 1375° C. for three hours in a 1% $N_2$-Ar atmosphere at 0.1 MPa (1 atm) for producing a modified surface layer (a N-containing surface layer having surface irregularities). The state of the cross-section in a direction at right angles to the rake face of the cutting edge of the inserts, and the surface states, of sample numbers 53, 56 and 58, among the inserts, are shown in FIGS. 14 to 16 and in FIGS. 17 to 19, respectively. The distribution of the thickness and that of the surface irregularities of the modified surface layer are shown in Table 6.

The above-mentioned honing was carried out using a "brush grinder" in which a liquid containing free diamond abrasive grains dispersed in oil is supplied to the inserts and a disc-shaped brush is rotated for contacting the liquid with the inserts. The operating conditions were set at a rpm of the brush of 300 to 600 rpm, a grade of the free diamond abrasive grains at #300 to #1000 and a processing time until the cutting end reached a pre-set radius of curvature of 1 to 10 minutes.

The surface state of the workpiece was set in conformity to the following criteria depending on the surface roughness Rz of the workpiece (mean roughness of ten points as prescribed in JIS B0601):
  good Rz≦6 μm
  acceptable 6 μm<Rz≦12 μm
  bad Rz>12 μm The preferred ranges of the machining time until film peeling-off are a range exceeding 60 minutes, more preferably exceeding 120 minutes, and a range exceeding 40 minutes, more preferably exceeding 70 minutes, for continuous cutting and for intermittent cutting, respectively.

The inserts thus produced were placed in a microwave plasma CVD device having a carrier frequency of 2.45 GHz and were maintained for ten hours in a mixed plasma of 98 vol % $H_2$-2% $CH_4$ heated to 850° C. and set to a total pressure of 6666 Pa (50 Torr) for producing diamond coated cutting inserts each having a film thickness of approximately 10 μm.

Using these cutting inserts, cutting tests were carried out under the following conditions. It is seen from Table 6 that the diamond-coated inserts of the present invention exhibit superior characteristics, with the time permitting machining with satisfactory surface accuracy without diamond film peeling-off being long, whereas, with the comparative Example, the diamond film exhibits only a poor adhesion strength and hence tends to be peeled off, with the time permitting machining of the workpiece with satisfactory surface accuracy being short and the substrate being occasionally fractured.

Continuous Cutting (machining an outer periphery of a rod-like workpiece having the diameter of approximately 150 mm and a length of approximately 200 mm).

workpiece: Al-18 wt % Si alloy cutting speed: 1500 m/min feed: 0.15 mm/rev depth of cut: 0.5 mm Intermittent Cutting: milling (machining the surface of a square plate about 150×150 mm in size and about 50 mm in thickness))

workpiece: Al-18 wt % Si alloy cutting speed: 1000 m/min feed: 0.1 mm/tooth depth of cut: 0.5 mm A scanning electron microscope (SEM) was fitted with a three-dimentional analyzer RD-500 manufactured by Yugen Kaisha DENSHI KOGAKU KENKYUSHO for measuring the surface state irregularities (surface roughness Rz).

The waveform of the cross-section presenting irregularities was found from the resulting data of the surface profile and transformed by Fourier transformation. After filtering off of the components having the period exceeding 25 $\mu$m and inverse Fourier transformation, substantially in the same manner as Example B, the ten points mean roughness Rz as prescribed in JIS B0601 was found of the resulting waveform of the irregularities. In this manner, the Rz value was obtained of the irregular components having the period of not more than 25 $\mu$m.

The surface roughness (Rz) of the cutting edge, which is an angle region, of each insert, having sample numbers 53 to 58 in Table 6, was approximately 31% (sample numbers 53 and 54), approximately 47% (sample number 55), approximately 69% (sample number 56) and approximately 84% (sample number 57) and 100% (sample number 38) of the surface roughness Rz of the central region.

It should be noted that modification obvious in the art may be done without departing from the scope of the present invention based on the gist thereof as herein claimed and disclosed in the entire application.

TABLES AND DRAWINGS

Tables 1–6 will follow on the subsequent pages, and the Drawings (FIGS. 1 to 19) are annexed to the Specification.

TABLE 1

| Kind of material | Composition of raw material powders (wt %) | | | | Sintering temp. (°C.) | Grain size of β phase ($\mu$m) | Remarks |
|---|---|---|---|---|---|---|---|
| | TiC | TaC | Co | WC and impurities | | | |
| A | — | — | 5 | bal | 1400 | — | |
| B | 0.1 | — | 5 | bal | 1400 | 2 | |
| C | 0.5 | — | 5 | bal | 1400 | 3 | |
| D | 3 | — | 5 | bal | 1450 | 3 | |
| E | 3 | 2 | 1 | bal | 1450 | 3 | difficult to sinter |
| F | 3 | 2 | 5 | bal | 1450 | 3 | |
| G | 3 | 2 | 16 | bal | 1450 | 3 | |
| H | 7 | 5 | 7 | bal | 1450 | 5 | |
| I | 25 | — | 10 | bal | 1450 | 5 | |
| J | 19 | 17 | 9 | bal | 1450 | 5 | |

TABLE 2

| sample No. | Kind of material | Heat treatment conditions | | | | | Surface roughness Rz ($\mu$m) | Surface crystal phase by X-ray analysis | Modified surface layer presence or not of modified surface layer formed of β (N) phase | Cutting line until peeling | | Remarks |
|---|---|---|---|---|---|---|---|---|---|---|---|---|
| | | Atmosphere (%) | | Pressure (atm) | Temperature (°C.) | Time (h) | | | | Continuous cutting (min) | Intermittent cutting (min) | |
| | | $N_2$ | Ar | | | | | | | | | |
| *1 | F | — | — | — | — | 1 | 0.9 | α > β >>> γ | NO | — | — | Nontreated, peeling after CVD |
| *2 | F | — | — | 0.00013 | 1375 | 1 | 1.5 | α > β >>> γ | NOT OBSERVED | <10 | <5 | In vacuum (0.1 Torr) |
| *3 | F | 0 | 100 | 1 | 1375 | 1 | 1.7 | α > β >>> γ | NOT OBSERVED | <10 | <5 | |
| *4 | F | 0.01 | 99.99 | 1 | 1375 | 1 | 1.8 | α > β >>> γ | YES (TRACE) | <10 | <5 | |
| 5 | F | 0.1 | 99.9 | 1.1 | 1375 | 1 | 3.5 | α, β >>> γ | YES | >30 | >20 | |
| 6 | F | 0.5 | 99.5 | 1 | 1375 | 1 | 5.2 | α, β >>> γ | YES | >50 | >30 | |
| *7 | F | 1 | 99 | 1 | 1300 | 1 | 1.7 | α > β >>> γ | NOT OBSERVED | <10 | <5 | |
| 8 | F | 1 | 99 | 1 | 1350 | 1 | 3 | β > α | YES | >50 | >30 | |
| 9 | F | 1 | 99 | 1 | 1375 | 1 | 5 | β > α | YES | >50 | >30 | |
| 10 | F | 1 | 99 | 1 | 1375 | 3 | 6.4 | β >> α | YES | >50 | >30 | |
| 11 | F | 1 | 99 | 1 | 1375 | 5 | 9.1 | β >>> α | YES | >50 | >30 | |
| *12 | F | 1 | 99 | 1 | 1375 | 10 | 21 | β | YES | <10 | <5 | Large Surface roughness, edge chipping |
| 13 | F | 1 | 99 | 1 | 1400 | 1 | 4.7 | β > α | YES | >50 | >30 | |
| 14 | F | 1 | 99 | 1 | 1425 | 1 | 4.5 | β > α | YES | >50 | >30 | |
| 15 | F | 1 | 99 | 1 | 1450 | 1 | 4.5 | β > α | YES | >50 | >30 | |
| *16 | F | 1 | 99 | 1 | 1500 | 1 | 4.4 | β > α | YES | <10 | <5 | Grain growth in substrate, edge chipping |
| 17 | F | 2 | 98 | 1 | 1375 | 1 | 3.5 | β > α | YES | >50 | >30 | |
| 18 | F | 2 | 98 | 1 | 1375 | 3 | 6.5 | β >> α | YES | >50 | >30 | |
| 19 | F | 2 | 98 | 1 | 1425 | 1 | 4.1 | β > α | YES | >50 | >30 | |
| 20 | F | 3 | 97 | 1 | 1375 | 1 | 3.4 | β > α | YES | >50 | >30 | |
| *21 | F | 5 | 95 | 1 | 1330 | 1 | 1.6 | α > β >>> γ | NOT OBSERVED | <10 | <5 | |
| *22 | F | 5 | 95 | 1 | 1340 | 1 | 1.9 | α > β > γ | NOT OBSERVED | <10 | <5 | |
| 23 | F | 5 | 95 | 0.9 | 1350 | 1 | 3.5 | β > α | YES | >30 | >20 | |
| *24 | F | 5 | 95 | 1 | 1375 | 1 | 3.6 | β, γ > α | YES | — | — | γ phase yielded in the surface, peeling after |

TABLE 2-continued

| sample No. | Kind of material | Atmosphere (%) N₂ | Ar | Pressure (atm) | Temperature (°C.) | Time (h) | Surface roughness Rz (μm) | Surface crystal phase by X-ray analysis | Modified surface layer presence or not of modified surface layer formed of β (N) phase | Cutting line until peeling Continuous cutting (min) | Cutting line until peeling Intermittent cutting (min) | Remarks |
|---|---|---|---|---|---|---|---|---|---|---|---|---|
| *25 | F | 10 | 90 | 1 | 1310 | 1 | 0.9 | α >> β, γ | NOT OBSERVED | <10 | <5 | CVD |
| *26 | F | 10 | 90 | 1 | 1320 | 1 | 0.9 | α >> β, γ | NOT OBSERVED | >10 | <5 | |
| *27 | F | 10 | 90 | 1 | 1350 | 1 | 3.5 | γ >> β > α | YES | — | — | γ phase yielded in the surface, peeling after CVD |
| *28 | F | 100 | 0 | 1 | 1300 | 1 | 0.9 | α > β >>> γ | NOT OBSERVED | <10 | <5 | |
| *29 | F | 100 | 0 | 1 | 1325 | 1 | 1.5 | TiN, β, γ | NOT OBSERVED | — | — | γ phase yielded in the surface, peeling after CVD |
| *30 | F | 100 | 0 | 1 | 1350 | 1 | 3.4 | γ > β | YES | — | — | γ phase yielded in the surface, peeling after CVD |

No mark: Inventive example
*Comparative example
1 ATM = 0.101 MPa

TABLE 3

| sample No. | Kind of material | Atmosphere (%) N₂ | Ar | Pressure (atm) | Temperature (°C.) | Time (h) | Surface roughness Rz (μm) | Surface crystal phase by X-ray analysis | Modified surface layer presence or not of modified surface layer formed of β (N) phase | Cutting line until peeling Continuous cutting (min) | Cutting line until peeling Intermittent cutting (min) | Remarks |
|---|---|---|---|---|---|---|---|---|---|---|---|---|
| *31 | F | 0 | 100 | 30 | 1320 | 1 | 26 | β >>> α, γ | YES | <10 | <5 | Sintered in BN case |
| *32 | F | 0.004 | 99.996 | 1000 | 1350 | 1 | 21 | β >>> α, γ | YES | <10 | <5 | |
| *33 | A | 2 | 98 | 1 | 1375 | 3 | 1.3 | α >>> γ | NO | <10 | <5 | No β phase |
| *34 | B | 2 | 98 | 1 | 1375 | 3 | 1.5 | α >>> β > γ | YES (trace) | <10 | <5 | Insufficient β phase |
| 35 | C | 2 | 98 | 0.8 | 1375 | 3 | 5.2 | α >> β >> γ | YES | >30 | >20 | |
| 36 | D | 2 | 98 | 1 | 1375 | 3 | 6.3 | α > β >>> γ | YES | >50 | >30 | |
| *37 | G | 2 | 98 | 1 | 1375 | 3 | 6.6 | α > β > γ | YES | <10 | <5 | Large amount of γ phase |
| 38 | H | 2 | 98 | 1.2 | 1375 | 3 | 7.1 | α, β >>> γ | YES | >30 | >20 | |
| *39 | I | 2 | 98 | 1 | 1375 | 3 | 13.5 | β | YES (HARD TO DISTINGUISH FROM THE INTERIOR) | <10 | <5 | Large amount of β phase, edge chipping |
| *40 | J | 2 | 98 | 1 | 1375 | 3 | 16.8 | β | YES (HARD TO DISTINGUISH FROM THE INTERIOR) | <10 | <5 | Large amount of β phase, edge chipping |

No mark: Inventive example
*Comparative example
1 ATM = 0.101 MPa

TABLE 4

| Kind of material | Composition of raw material powders (wt %) TiC | TaC | Co | WC and impurities | Sintering temp. (°C.) | Grain size of β phase (μm) | Remarks |
|---|---|---|---|---|---|---|---|
| a | 0.5 | — | 5 | bal | 1400 | 3 | C of Table 1 |
| b | 3 | — | 5 | bal | 1450 | 3 | D of Table 1 |

TABLE 4-continued

| Kind of material | Composition of raw material powders (wt %) | | | | Sintering temp. (°C.) | Grain size of β phase (μm) | Remarks |
|---|---|---|---|---|---|---|---|
| | TiC | TaC | Co | WC and impurities | | | |
| c | 3 | 2 | 5 | bal | 1450 | 3 | F of Table 1 |
| d | 7 | 5 | 7 | bal | 1450 | 5 | H of Table 1 |

TABLE 5

| Sample No. | Kind of material | Heat treatment conditions | | | | | Surface roughness Rz | | Image analysis | | Surface crystal phase by X-ray analysis | Modified surface layer presence or not of modified surface layer formed of β (N) phase | Cutting line until peeling | |
|---|---|---|---|---|---|---|---|---|---|---|---|---|---|---|
| | | Atomosphere (%) | | Pressure (atm) | Temperature (°C.) | Time (h) | Contractor (μm) | Non-contact (μm) | Engage ratio | Amplitude (μm) | | | Continuous cutting test (min) | Intermittent cutting test (min) |
| | | N₂ | Ar | | | | | | | | | | | |
| *41 | c | — | — | — | — | — | 0.9 | 0.5 | 1.1 | 0.5 | α > β >>> γ | NO | — | — |
| 42 | c | 0.1 | 99.9 | 1.1 | 1375 | 1 | 3.5 | 3 | 1.2 | 3 | α, β >>> γ | YES | >30 | >20 |
| *43 | c | 1 | 99 | 1 | 1330 | 1 | 2.3 | 1.5 | 1.1 | 1.5 | β > α | YES | <20 | <10 |
| 44 | c | 1 | 99 | 1 | 1375 | 1 | 5 | 4.9 | 1.4 | 5 | β > α | YES | >50 | >30 |
| 45 | c | 1 | 99 | 1 | 1375 | 3 | 6.4 | 4.9 | 1.5 | 6 | β >> α | YES | >60 | >40 |
| 46 | c | 1 | 99 | 1 | 1375 | 5 | 9.1 | 4.8 | 1.6 | 12 | β >>> α | YES | >60 | >40 |
| *47 | c | 1 | 99 | 1 | 1375 | 10 | 21 | 12 | 2 | 25 | β | YES | <10 | <5 |
| *48 | c | 0 | 100 | 30 | 1320 | 1 | 26 | 15 | 2.6 | 30 | β >>> α, γ | YES | <10 | <5 |
| 49 | a | 2 | 98 | 0.8 | 1375 | 3 | 5.2 | 3.7 | 1.3 | 4 | α >> β >> γ | YES | >30 | >20 |
| 50 | b | 2 | 98 | 1 | 1375 | 3 | 6.3 | 4.5 | 1.4 | 5 | α > β >>> γ | YES | >50 | >30 |
| 51 | d | 2 | 98 | 1.2 | 1375 | 3 | 7.1 | 5.3 | 1.5 | 3 | α, β >>> γ | YES | >30 | >20 |
| *52 | c | 0.01 | 99.99 | 10 | 1350 | 3 | 8.2 | 2.8 | 1.2 | 2 | β >> α | YES | <20 | <10 |

No mark: Inventive example
*Comparative example
1 ATM = 0.101 MPa

TABLE 6

| Sample No. | Honing (R: μm) | Thickness of modified surface layer | | Surface irregularity | | Cutting time until peeling | | Surface state of work |
|---|---|---|---|---|---|---|---|---|
| | | Edge (μm) | Center (μm) | Edge (μm) | Center (μm) | Continuous cutting test (min) | Intermittent cutting test (min) | |
| *53 | 0 | 2.5 | 8 | 1.5 | 4.9 | >50 | >30 | good |
| *54 | 0.002 | 3 | 8 | 1.5 | 4.9 | >50 | >30 | good |
| 55 | 0.008 | 4.5 | 8 | 2.3 | 4.9 | >60 | >40 | good |
| 56 | 0.03 | 6 | 8 | 3.4 | 4.9 | >120 | >70 | good |
| 57 | 0.08 | 7.2 | 8 | 4.1 | 4.9 | >110 | >65 | slightly good |
| 58 | 0.12 | 8 | 8 | 4.9 | 4.9 | >105 | >60 | bad |

No mark: Inventive example
*Comparative example

What is claimed is:

1. A method for producing a substrate for coating comprising
   (a) providing a WC-based cemented carbide piece mainly composed of WC,
   (b) heat-treating said cemented carbide piece at a temperature not lower than a temperature at which a liquid phase of said WC-based cemented carbide piece is generated and not higher than its sintering temperature under a normal-pressure atmosphere containing a N2 gas of 0.05 to 5 vol %, preferably 0.5 to 3 vol %,
   (c) forming a N-containing surface layer presenting surface irregularities on a surface of said WC-based cemented carbide piece.

2. A method for producing a substrate for coating comprising
   (a) providing an angle region of a WC-based cemented carbide piece, mainly composed of WC, with a rounded profile in which a profile line on the cross-section of the angle region comprises a curve having a radius of curvature R of not less than 0.005 mm,
   (b) heat-treating the WC-based cemented carbide piece from the step (a) at a temperature not lower than a temperature of generating a liquid phase of said WC-based cemented carbide and lower than its sintering temperature, under a normal-pressure atmosphere containing 0.05 to 5 vol %, preferably 0.5 to 3 vol %, of a N2 gas, and (c) forming a N-containing surface layer presenting surface irregularities on a surface of said WC-based cemented carbide piece.

3. The method as defined in claim 1 or 2 further comprising forming a N-containing surface layer presenting basic surface irregularities having a surface roughness Rz of 2 to 20 μm on the surface of said WC-based cemented carbide piece.

4. The method as defined in claim 1 or 2 further comprising forming a N-containing surface layer presenting a dual irregular surface on the surface of said WC-based cemented carbide piece, wherein said dual irregularities presenting micro-sized irregularities having a size on the order of crystal grains constituting an uppermost surface and being formed on said N-containing surface layer presenting basic surface irregularities.

5. The method as defined in claim 1 or 2 wherein said N-containing surface layer presenting basic irregularities is processed such that the basic surface irregularities attain an engaging ratio of 1.2 to 2.5 and an amplitude of 2 to 20 μm.

6. The method as defined in any one of claims 1 or 2 wherein said N-containing surface layer presenting basic surface irregularities is processed such that the basic surface irregularities attain a surface roughness Rz of 3 to 10 μm measured on components of irregularities with a period not larger than 25 μm.

7. The method as defined in claim 1 or 2 wherein said WC-based cemented carbide piece is mainly composed of WC and containing Ti or Ti and Ta, along with at least one of Co and Ni.

8. The method as defined in claim 1 or 2 wherein said N-containing surface layer presenting surface irregularities is mainly composed of at least one of a W—Ti—C—N solid solution and a W—Ti—Ta—C—N solid solution.

9. The method as defined in claim 1 or 2 wherein the heat-treating is carried out at 1350° to 1400° C., and wherein the surface irregularities are controlled by the heat-treating time and the N concentration in the atmosphere for the heat-treatment.

10. The method as defined in claim 1 or 2 which further comprises an additional heat-treatment to discharge N from the N-containing surface layer.

11. The method as defined in claim 1 or 2 which further comprises an additional step for coating a hard coating film through a vapor deposition method to a thickness which does not essentially change the surface state of the surface irregularities.

12. The method as defined in claim 1 or 2 wherein said WC-based cemented carbide piece comprises 0.2–20 wt % of Ti, or Ti and Ta (both calculated as carbide), and 2–15 wt % of at least one of Co and Ni.

13. The method as defined in claim 1 or 2 wherein said WC-based cemented carbide piece mainly comprises one or both of W—Ti—C solid solution (termed as β phase) and a W—Ti—Ta—C solid solution (termed as βt phase).

14. The method as defined in claim 13 wherein said β phase and/or βt phase has an average grain size of 0.5 to 10 μm.

* * * * *